(12) United States Patent
Leung

(10) Patent No.: US 7,598,769 B2
(45) Date of Patent: Oct. 6, 2009

(54) APPARATUS AND METHOD FOR A PROGRAMMABLE LOGIC DEVICE HAVING IMPROVED LOOK UP TABLES

(75) Inventor: Vincent Leung, San Francisco, CA (US)

(73) Assignee: Altera Corporation, San Jose, CA (US)

( * ) Notice: Subject to any disclaimer, the term of this patent is extended or adjusted under 35 U.S.C. 154(b) by 174 days.

(21) Appl. No.: 11/675,590

(22) Filed: Feb. 15, 2007
(Under 37 CFR 1.47)

(65) Prior Publication Data
US 2008/0197879 A1    Aug. 21, 2008

(51) Int. Cl.
*H03K 19/173* (2006.01)
(52) U.S. Cl. .......................... 326/40; 326/46
(58) Field of Classification Search ............. 326/37–41, 326/46, 47
See application file for complete search history.

(56) References Cited

U.S. PATENT DOCUMENTS 5,399,925 A * 3/1995 Nguyen ........................ 326/58

OTHER PUBLICATIONS

IBM Technical Disclosure Bulletin, May 1987, NN97055561, 6 pages.*

"STRATIX II Device Handbook, vol. 1 and vol. 2" Altera Corporation, May 2007, Downloaded from: http://www.altera.com/literature/hb/stx2/stratix2_handbook.pdf, on Oct. 3, 2007, vol. 1 : pp. 1-1 to 6-2 vol. 2 : pp. 1-1 to 11-32.
"STRATIX II Architecture," Altera Corporation, May 2007, downloaded form: http://www.altera.com/literature/hb/stx2/stx2_sii51002.pdf, on Oct. 3, 2007, pp. 2-1 to 2-106.
"VIRTEX 4 Family Overview," Xilinx, Inc., DS112 (v1.3) Mar. 26, 2005, Downloaded from: http://picocomputing.com/pdf/www/E-12/Third%20Party%20Manuals/Virtex-4%20FPGA/Virtex-4%20Overview%20V1.3.pdf, on Oct. 3, 2007, pp. 1-9.
"STRATIX Architecture," Altera Corporation, Jul. 2005, downloaded from http://www.altera.com/literature/hb/stx/ch_2_vol_1.pdf on Oct. 6, 2007, pp. 2-1 to 2-140.

* cited by examiner

*Primary Examiner*—Daniel D Chang
(74) *Attorney, Agent, or Firm*—Weaver Austin Villeneuve Sampson LLP

(57) ABSTRACT

A programmable logic device including a plurality of logic elements organized in an array. Each of the logic elements includes an N-stage Look Up Table structure having $2^N$ configuration bit inputs and a Look Up Table output. The first stage of the Look Up Table includes $2^N$ tri-state buffers coupled to receive the $2^N$ configuration bit inputs respectively. A decoder, configured from logic gates, is coupled to receive to one or more Look Up Table select signals and to generate a set of control signals to control the $2^N$ tri-state buffers so that one or more of the $2^N$ configuration bit inputs is selected by the first stage. The configuration bits are then provided to subsequent muxing stages in the Look Up Table.

25 Claims, 9 Drawing Sheets

US 7,598,769 B2

APPARATUS AND METHOD FOR A PROGRAMMABLE LOGIC DEVICE HAVING IMPROVED LOOK UP TABLES

BACKGROUND

1. Field of the Invention

The present invention generally relates to programmable logic devices, and more particularly, to a programmable logic device having Look Up Tables using a tri-state driver stage to improve speed, reduce power consumption, and reduce area layout compared to conventional Look Up Tables using muxes.

2. Description of Related Art

A Programmable Logic Device (PLD) is a semiconductor integrated circuit that contains fixed logic circuitry that can be programmed to perform a host of logic functions. In the semiconductor industry, PLDs are becoming increasingly popular for a number of reasons. Due to the advances of chip manufacturing technology, application specific integrated circuits (ASICs) designs have become incredibly complex. This complexity not only adds to design costs, but also the duration of time needed to develop an application specific design. To compound this problem, product life cycles are shrinking rapidly. As a result, it is often not feasible for original equipment manufacturers (OEMs) to design and use ASICs. OEMs are therefore relying more and more on PLDs. The same advances in fabrication technology have also resulted in PLDs with improved density and speed performance. Sophisticated programming software enables complex logic functions to be rapidly developed for PLDs. Furthermore, logic designs generally can also be easily migrated from one generation of PLDs to the next, further reducing product development times. The closing of the price-performance gap with ASICs and reduced product development times makes the use of PLDs compelling for many OEMs.

Most PLDs contain a two-dimensional row and column based architecture to implement custom logic. A series of row and column interconnects, typically of varying length and speed, provide signal and clock interconnects between blocks of logic on the PLD. PLDs also include basic logic elements for implementing user defined logic functions, often referred to in the industry by such names as Logic Elements (LEs), Adaptive Logic Modules (ALMs), or Complex Logic Blocks (CLBs). The basic logic elements, regardless of what they are called, usually include one or more Look Up Table (LUTs), registers for generating registered logic outputs, adders and other circuitry to implement various logic and arithmetic functions. For the purposes of the present invention, the term Logic Element as used herein, unless otherwise specified, shall mean a generic logic element, including but not limited to ALMs, CLBs, and LEs.

The Look Up Table used in most commercially available PLDs is a 16:1 mux. Four select inputs are applied to a plurality of two to one (2:1) muxes to select one of possible sixteen (1:16) possible configuration RAM bit inputs. The 2:1 muxes are typically organized into four stages in a cascaded, tree structure. In the first stage, the contents of the 16 configuration RAM bits are connected to the inputs of a first set of eight 2:1 muxes. In the second stage, four 2:1 muxes are configured to receive the outputs of the first stage muxes respectively. Similarly, in the third stage, two 2:1 muxes receive the outputs of the four muxes of the previous stage. Finally, in the fourth stage, one 2:1 mux is coupled to receive the outputs of the two muxes of the third stage. Four select signals A, B, C and D are coupled to each of the muxes in the four stages respectively. The first, second, third and forth select signals A, B, C and D are used to select (8 of 16), (4 of 8), (2 of 4) and (1 of 2) inputs provided to the first, second, third and fourth muxing stages respectively. By programming the contents of the 16 configuration RAM bits, various logic functions can be implemented in the Look Up Table.

In the semiconductor industry, there is a continuous drive to improve chip fabrication technology. With each new generation of fabrication technology, the device and feature size of the components used to implement the integrated circuitry on a die, such as transistors and interconnect, become smaller and smaller. While the smaller geometries are generally desirable because they allow greater circuit functionality to be designed and implemented on a die of a given size, there are some undesirable drawbacks. For example, as device geometries become smaller and smaller, transistors tend to "leak" current. In other words, transistors conduct current even when they are supposed to be tuned-off and non-conductive.

This issue, commonly referred to as "sub-threshold leakage", is problematic for several reasons. The sub-threshold leakage of a large number of transistors on the chip increases power consumption. The increased power consumption causes the chip to run hot. This heat may degrade the performance, or in severe situations, may cause the chip to operate improperly or outside of specifications. In some situations, a heat sink may be needed to mitigate the problem. The additional power consumption may also be a problem if the chip is used in a battery power device.

A Programmable Logic Device having Look Up Tables using a tri-state driver stage to improved speed, reduced power consumption and area compared to conventional Look Up Tables using muxes is therefore needed.

SUMMARY OF THE INVENTION

A Programmable Logic Device having Look Up Tables using a tri-state driver stage to improved speed, reduced power consumption and area compared to conventional Look Up Tables using conventional muxes is disclosed. The programmable logic device includes a plurality of logic elements organized in an array. Each of the logic elements includes a Look Up Table structure having configuration bit inputs and a Look Up Table output. The first stage of the Look Up Table includes a plurality of tri-state buffers coupled to receive the configuration bit inputs respectively. A decoder, configured from logic gates, is coupled to receive to one or more Look Up Table select signals and to generate a set of control signals to control the tri-state buffers of the first stage of the Look Up Table so that one or more of the configuration bit inputs is selected by the first stage. The configuration bits are then provided to subsequent muxing stages in the Look Up Table.

BRIEF DESCRIPTION OF THE DRAWINGS

The invention may best be understood by reference to the following description taken in conjunction with the accompanying drawings, which illustrate specific embodiments of the present invention.

It should be noted that like reference numbers refer to like elements in the figures.

DETAILED DESCRIPTION OF SPECIFIC EMBODIMENTS

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention. Further, it should be noted that the techniques of the present invention could be applied to a variety of systems or electronic devices such as programmable devices and application-specific integrated circuit (ASIC) devices.

Figure 1:
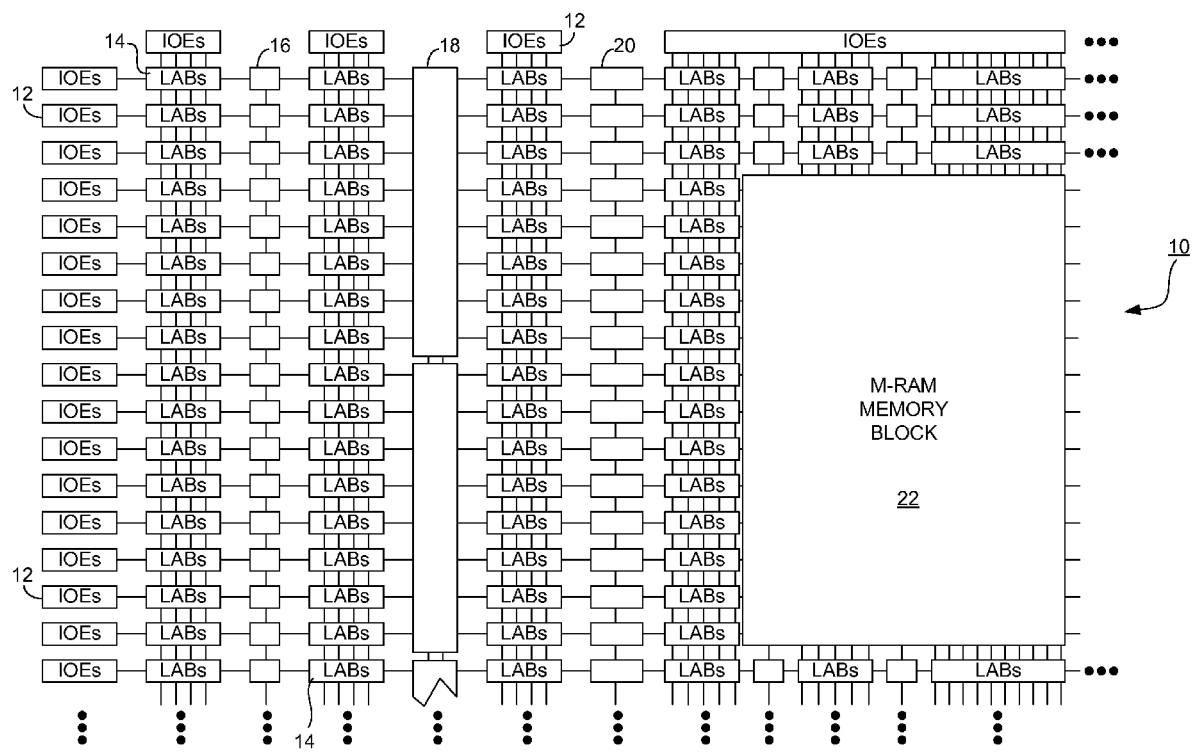
FIG. 1 a block diagram of an exemplary programmable logic device.

Referring to FIG. 1, a block diagram of an exemplary Programmable Logic Device (PLD) of the present invention is shown. The PLD 10 includes a two dimensional row and column based architecture including a plurality of Input/Output elements (IOEs) 12 arranged around the periphery of the chip, a plurality of Logic Array Blocks (LABs) 14 grouped into rows and columns across the device, Random Access Memory (RAM) blocks 16 grouped into columns between certain LABs 14, Digital Signal Processing (DSP) blocks 18 grouped into columns across the device, second RAM blocks 20 also grouped into columns across the device and between certain LABs 14, and one or more M-RAM memory blocks 22 each provided at different locations across the device.

Two commercially available PLDs using the same or similar architecture illustrated herein are the Stratix® I and Stratix® II devices offered by Altera Corporation, the assignee of the present invention. For more details on these PLDs, see for example, The Stratix® Architecture, Functional Description, pages 2-1 through 2-140, from the Altera Corporation, July, 2005 (Altera Internal document Number S51002-3.2) and The Stratix® II Architecture, Functional Description, pages 2-104, The Stratix® II Device handbook, Volume 1, December 2005 (Altera Internal Document Number SII51002-4.0), both incorporated by reference herein for all purposes.

Figure 2:
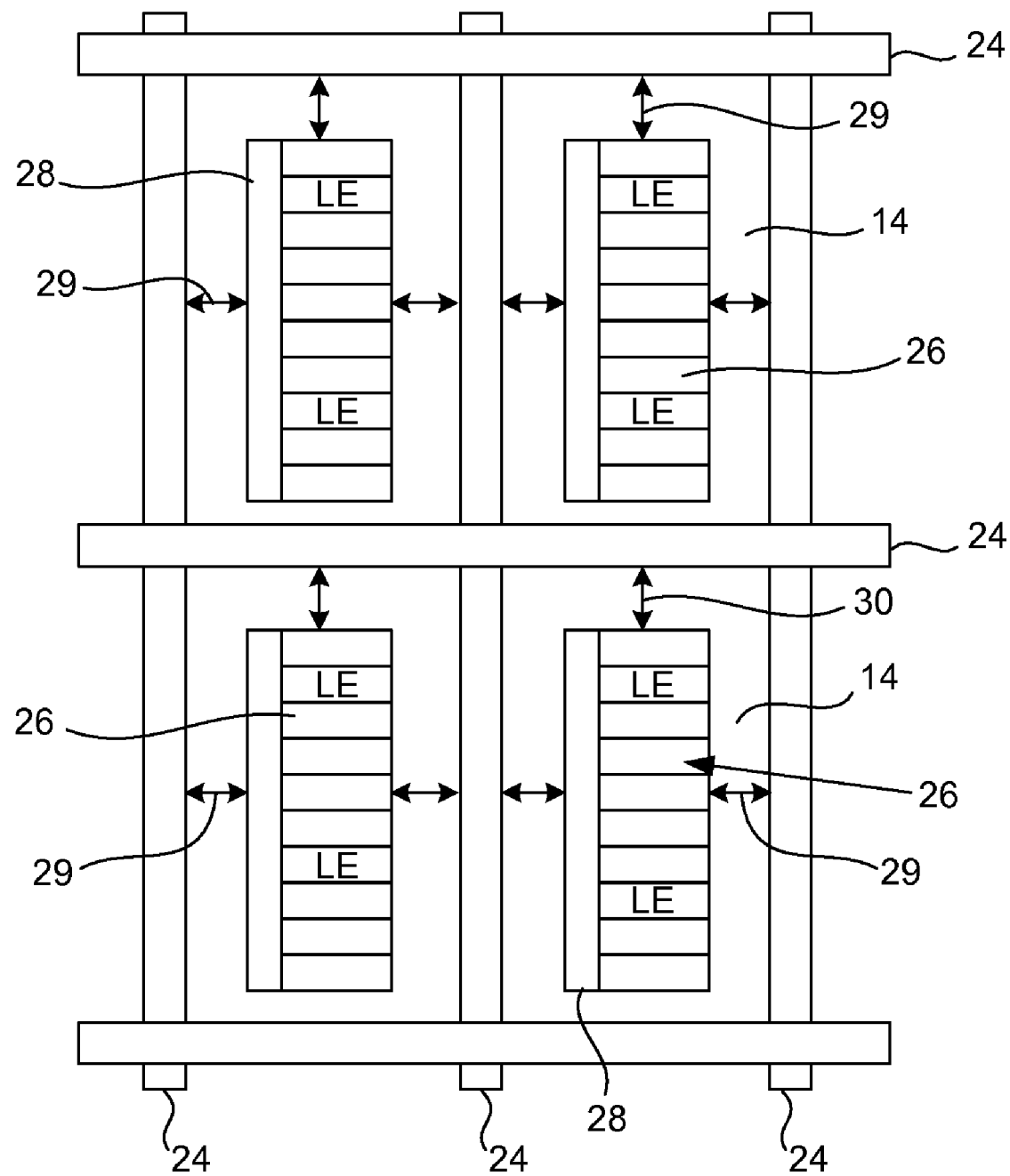
FIG. 2 is a block diagram of a Logic Array Block (LAB) in the exemplary programmable logic device.

Referring to FIG. 2, a block diagram of several logic array blocks (LABs) in an exemplary PLD 10 is shown. The figure shows four LABs 14 interconnected by a plurality of general horizontal (row) and vertical (column) interconnect lines 24. Each LAB 14 includes a plurality of Logic Elements (LEs) 26. In the embodiment shown, there are ten (10) LEs 26 per LAB 14. It should be noted that this number is arbitrary, and that any number of LEs 26 may be used per LAB 14. A LAB wide interconnect 28 is also provided to interconnect the LEs 26 within each LAB 14. Interconnects 29 are provided between the LEs 26 of each LAB 14 and the general horizontal and vertical interconnects 24.

Figure 3:
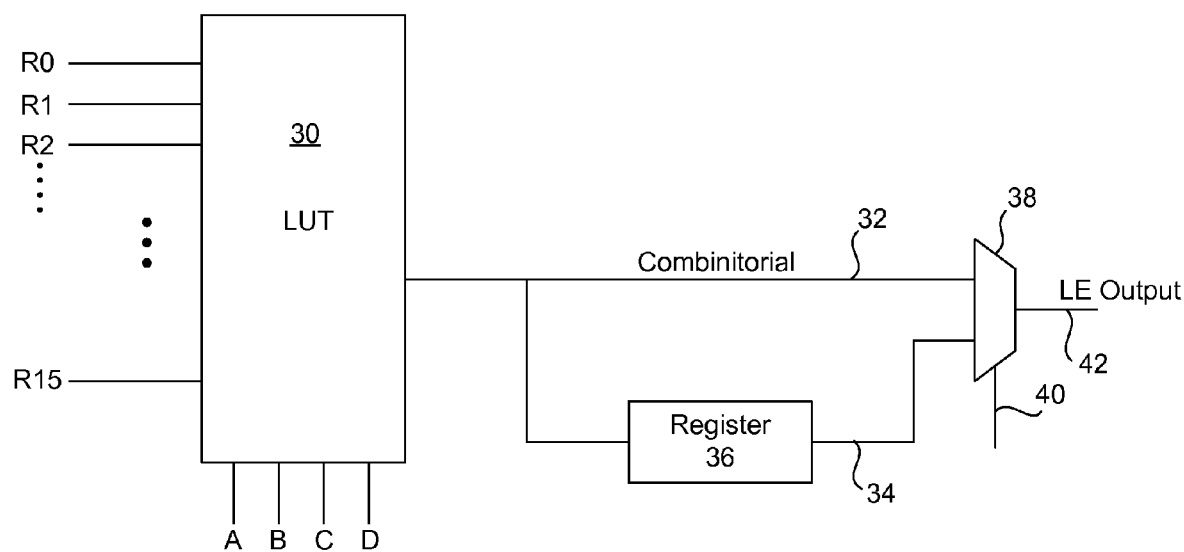
FIG. 3 is a diagram of a Logic Element in the exemplary programmable logic device.

Referring to FIG. 3, a simplified diagram of a Logic Element (LE) 26 according to the present invention is shown. The LE 26 includes Look Up Table 30 coupled to receive 16 configuration RAM input bits (labeled R0 through R15) and four select signals labeled A through D. The Look Up table 30 generates a combinational output signal 32 or a registered output signal 34 through register 36. An output mux 38 is coupled to receive the combinational output 32 and the registered output 36 as inputs. In response to a select signal 40, the mux 38 selects as either the combinational signal 32 or the registered signal 34 as the LE output 42.

Figure 4:
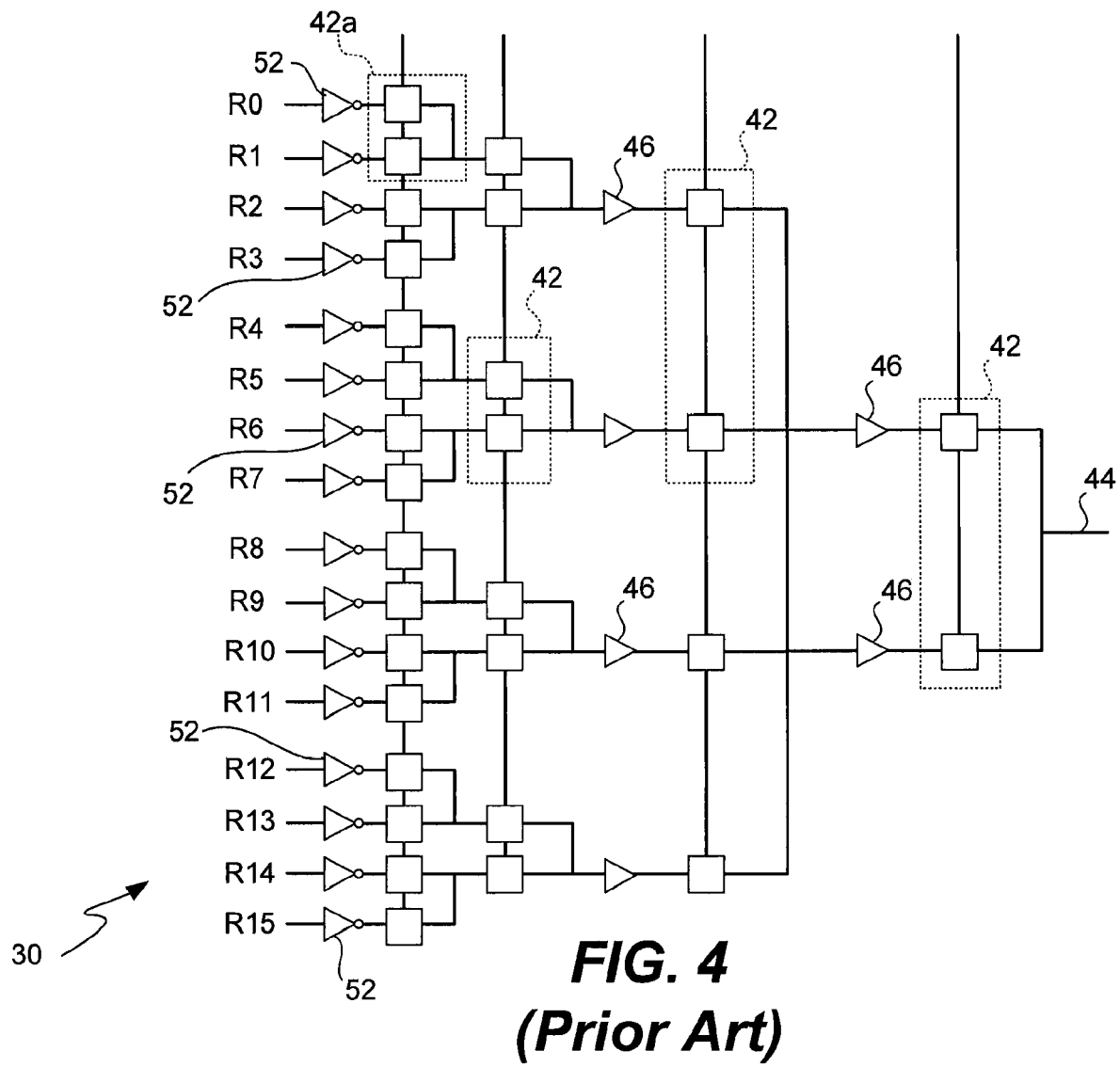
FIG. 4 is a diagram of the muxing structure in a Look Up Table according to the prior art.

Referring to FIG. 4, a diagram of the muxing structure in the Look Up Table 30 according to the prior art is shown. The Look Up Table 30 includes four stages configured to receive a select signal A, B, C and D respectively. In the first stage, the contents of the 16 configuration RAM bits R1 through R15 are connected to the inputs of a first set of eight (2:1) muxes 42 through inverters 52 respectively. In the second stage, four (2:1) muxes 42 are configured to receive the outputs of the first stage muxes respectively. Similarly, in the third stage, two (2:1) muxes 42 receive the outputs of the four muxes of the previous stage. Finally, in the fourth stage, one (2:1) mux 42 is coupled to receive the outputs of the two muxes of the third stage. Depending on the state of the four select signals A, B, C and D, the contents of one of the configuration RAM bits R1 through R15 is provided at the output 44 of the Look Up Table 30. The select signals A, B, C and D are used to select (8 of 16), (4 of 8), (2 of 4) and (1 of 2) inputs provided to the first, second, third and fourth stages respectively. A plurality of buffers 46 are provided after stages B and C to drive the subsequent stages C and D respectively.

Figure 5:
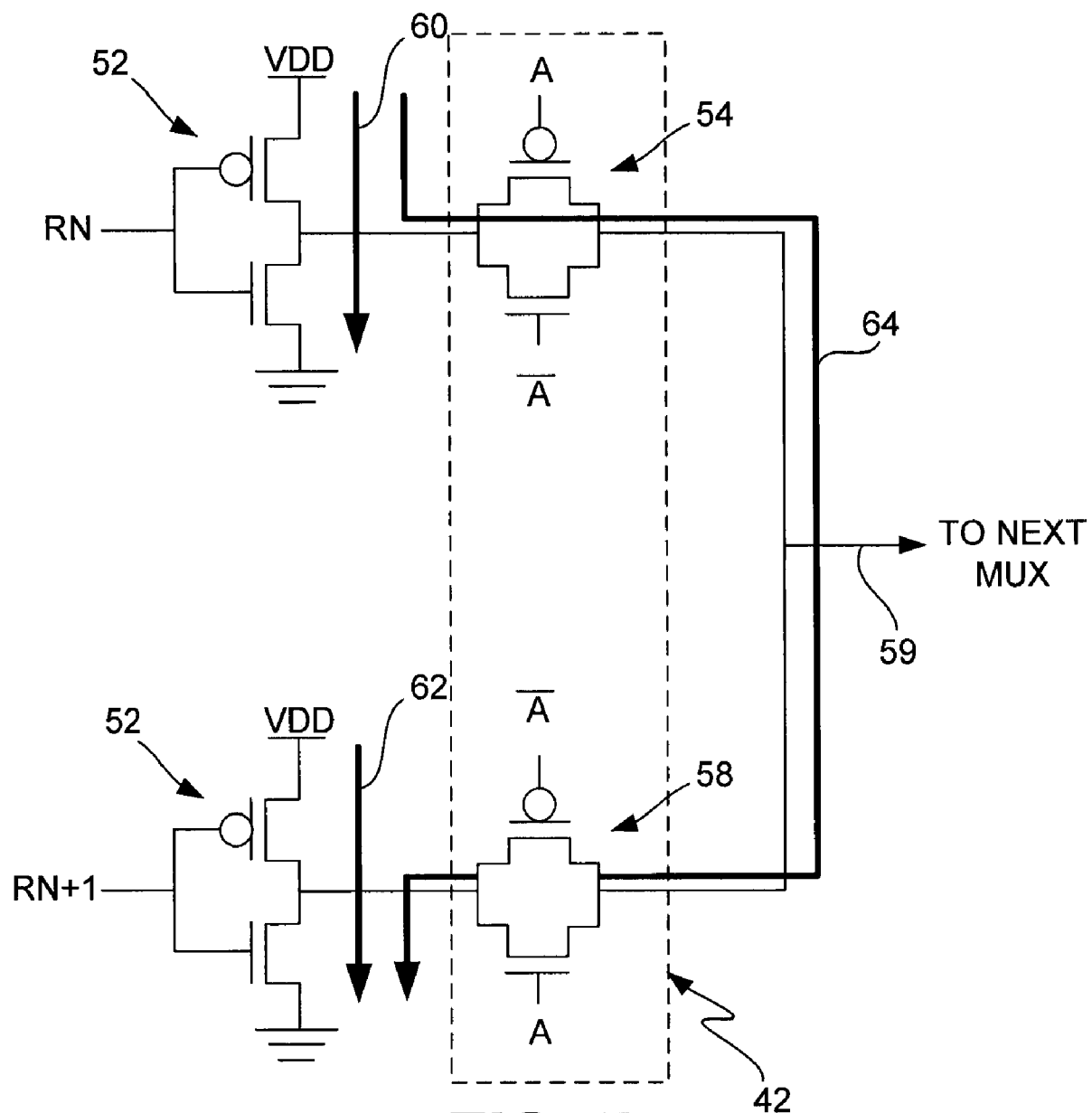
FIG. 5 is a diagram of mux used in the prior art Look Up Table.

Referring to FIG. 5, a diagram of a mux 42 is shown. The mux 42 includes a first transmission gate 54 and a second transmission gate 58. The two transmission gates 54, 58 are driven by the RN and RN+1 configuration RAM signals through two inverters 52 respectively. Both inverters 52 include a p-channel transistor and an n-channel transistor having their channels coupled between VDD and ground. The gates of the p and n channel transistors of the first inverter 52 and the second inverter 52 are coupled to configuration bits "RN" and "RN+1" respectively. The transmission gates 54 and 58 both include a p-channel transistor and an n-channel transistor. With the first transmission gate 54, the p-channel is coupled to a select signal (e.g. A) while the n-channel is coupled to the complement select signal $\overline{A}$. The source/drain terminals of the two transistors are connected to one another. The second transmission gate 58 is coupled in the complement of the first transmission gate 54. $\overline{A}$ is coupled to the p-channel while the select signal A is coupled to the n-channel transistor. Again, the source/drain terminals of the two transistors are coupled to one another.

With the above-described arrangement, when the select signal is low (e.g. A=0, $\overline{A}$=1), both transistors of the first transmission gate 54 are turned on, allowing Input N to be provided to the output 59 of the mux. The transistors of the second transmission gate 58 are both off, preventing the contents of Input N+1 from being placed on the output 59 of the mux. When the complement of the select signal is asserted (e.g., A=1, $\overline{A}$=Ø), the transistors of the second transmission gate 58 are turned on, while first transmission gate 54 is turned off, providing the contents of Input N+1 at the output 59.

There are a number of issues associated with the mux 42. Namely, as the geometries of the transistors shrink due to advances in semiconductor fabrication technology, the problem of sub-threshold leakage becomes more pronounced. The arrows designated by reference numerals 60, 62 and 64, show the sub-threshold leakage paths through the first inverter 52, second inverter 56 and the transmission gates 54, 58 in each mux 42 in the Look Up Table 30. In addition, the transistors in the buffers 46 provided between the stages of the Look Up Table 30, are also susceptible to the same leakage problem.

Each mux 42 provided in the Look Up Table 30, regardless of the stage, is identical to that described above. For the sake of brevity, however, only one mux 42 is generically described and illustrated in FIG. 5. Only the configuration bit inputs R0 through R15, inputs from a previous stage mux 42, and/or the select inputs (either A, B, C or D) differ for each mux 42. The operation of all the muxes 42 are otherwise all the same as described above.

Figure 6:
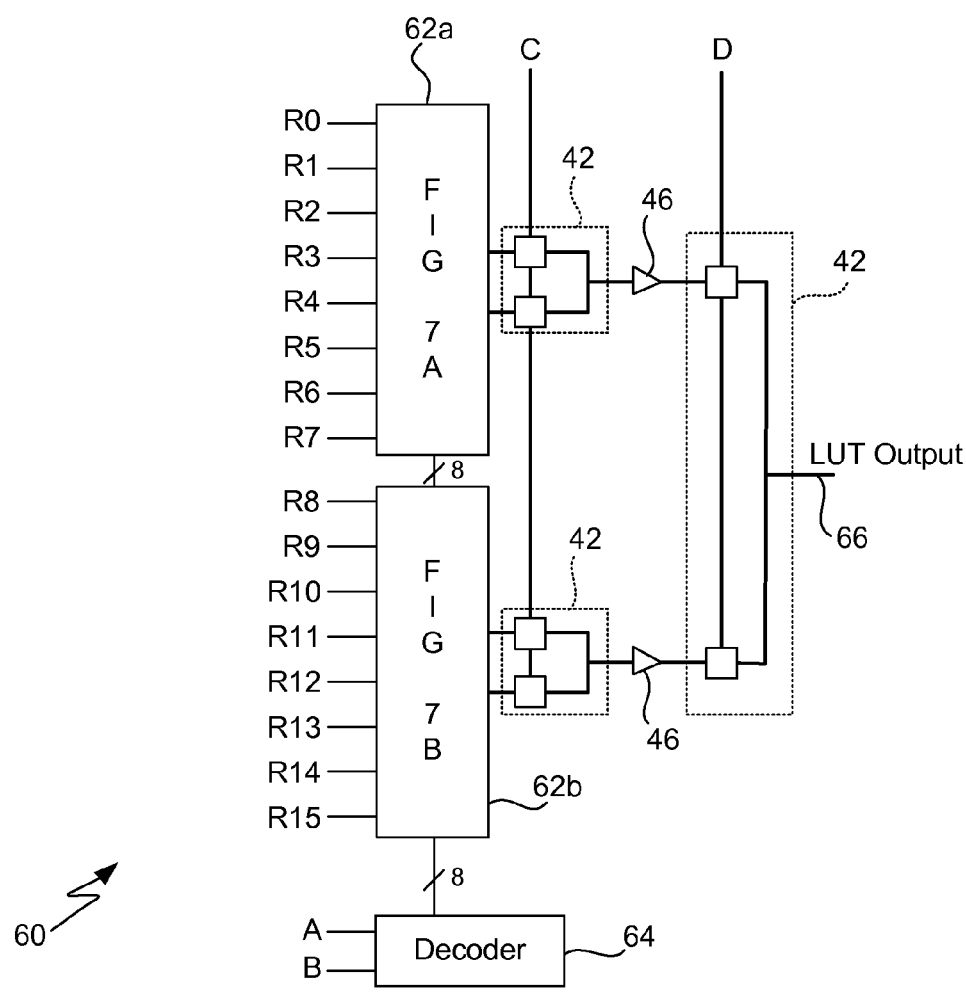
FIG. 6 is a diagram of a Look Up Table according to the present invention.

Referring to FIG. 6, a diagram of a Look Up Table according to the present invention is shown. The Look Up Table 60 includes a tri-state buffer stage 62*a* coupled to receive configuration RAM bits R0 through R7, a tri-state buffer stage 62*b* coupled to receive configuration RAM bits R8 through R15, a decoder 64 coupled to the buffer stages 62*a* and 62*b* and used to pre-decode select signals A and B, a pair of muxes 42 coupled to receive select signal C, and an output mux 42 coupled to select signal D. Buffers 46 are provided between the muxes 42 of the C and D stages. The output of the Look Up Table 60 is designated by signal 66. The tri-state buffer stages 62*a* and 62*b* and decoder 64 are logically equivalent A and B stages describe above with regard to the conventional Look Up Table illustrated in FIG. 4 for example.

A comparison of the Look Up Table 60 of FIG. 6 and that of FIG. 4 indicates a number of differences. The tri-state buffers 62*a* and 62*b* replace the inverters 52, the muxes 42 of the A and B stages, and the buffers 46 at the output of stage B. Consequently, there is one less stage and significantly fewer devices. The fewer number of transistors reduces leakage current and power. It also operates faster since there is one less stage than with conventional Look Up Tables. With fewer stages, there is one less gate delay and as a result, the output signal can propagate faster though the circuit. Lastly, since there are fewer transistors, the area or layout on the die can be made smaller. This is particularly true with the elimination of the transistors of the inverters 52, which tend to be relatively large devices.

Figure 7A:
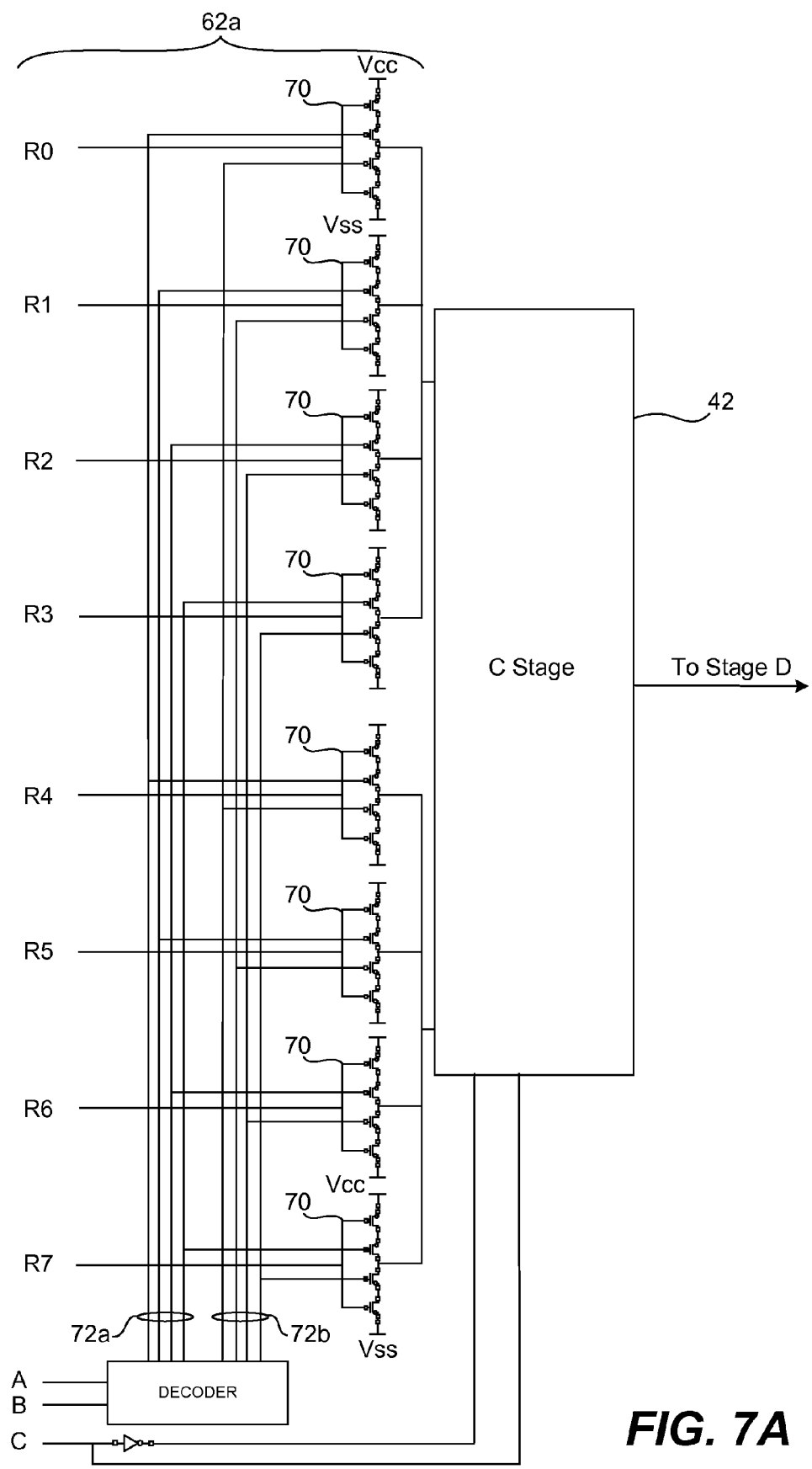
FIGS. 7A and 7B are diagrams of the first stage of the Look Up table of the present invention.
Figure 7B:
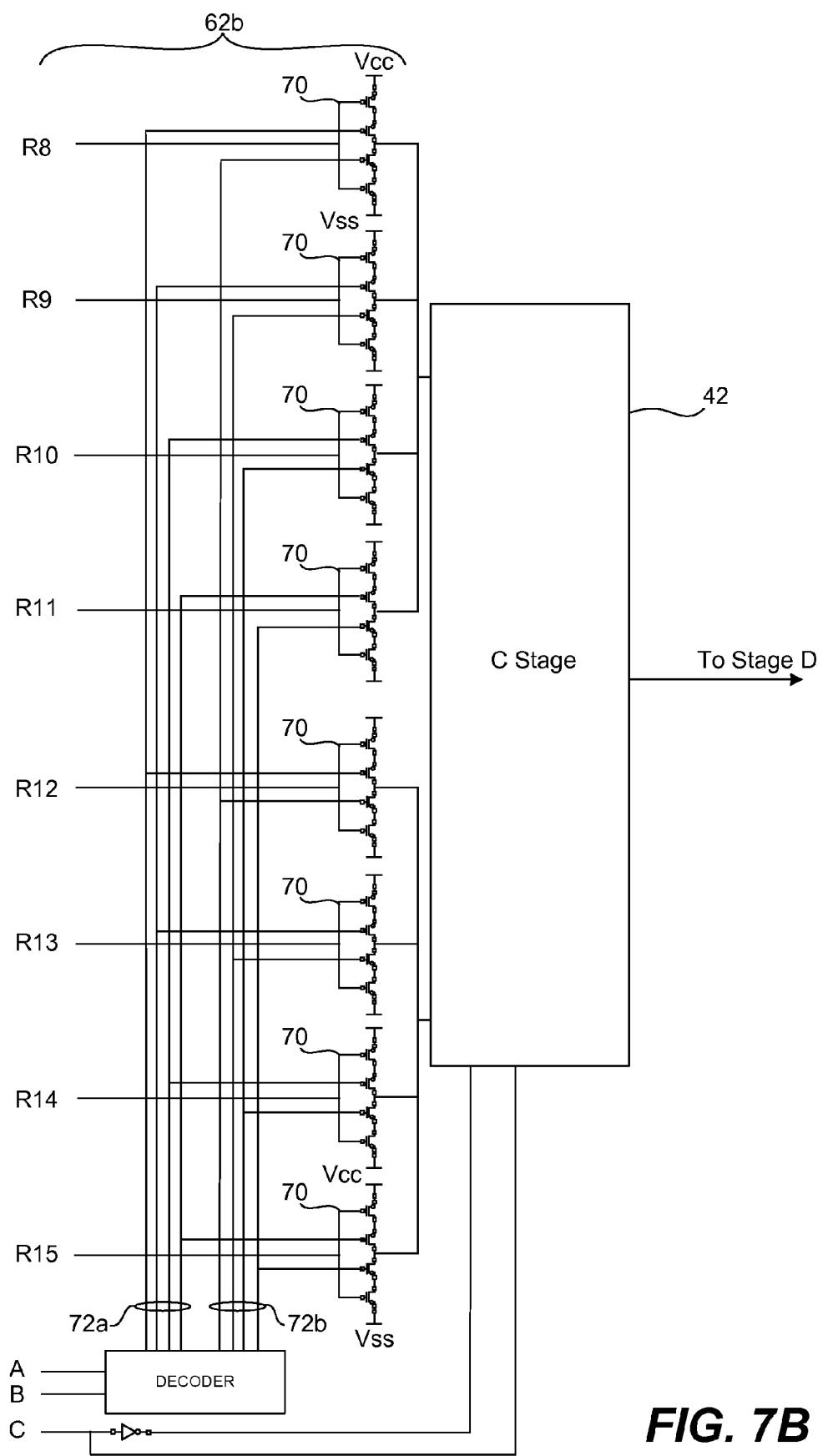

Referring to FIGS. 7A and 7B, logic diagrams of the tri-state buffer stages 62*a* and 62*b* of Look Up Table 60 of the present invention are shown respectively. Referring initially to FIG. 7A, the buffer stage 62*a* includes the configuration RAM bits R0 through R7 coupled to eight tri-state buffers 70 respectively. The decoder 64 is a standard decoder constructed using conventional logic gates (i.e., AND, NAND, OR, NOR, EXOR gates or a combination thereof). In the embodiment shown, the decoder generates two sets of identical control signals designated by reference numerals 72*a* and 72*b* respectively. Each set 72*a* and 72*b* includes four signals. For each set 72*a* and 72*b*, a different signal is connected to the to the upper four and the lower four tri-state buffers 70 respectively. In other words, the R0-R3 and R4-R7 tri-state buffers 70 are identically wired to signals 72*a* and 72*b* respectively. Thus, depending on the state of the two select inputs A and B, two of the eight tri-state buffers 70 are activated, allowing the contents of their respective configuration RAM cells to pass onto the mux 42 controlled by select signal C.

The tri-state buffer 62*b* of FIG. 7B is essentially the same as that described above except the tri-state buffers 70 are connected to configuration RAM cells R8 through R15 respectively. Again, depending on the state of the two select inputs A and B, two of the eight tri-state buffers 70 in buffer 62*b* are activated, allowing the contents of their respective configuration RAM cells to pass onto the mux 42 controlled by select signal C. Accordingly, between the two buffer stages 62*a* and 62*b*, the contents of four of the configuration RAM cells R0 through R15 are selected and pass to the muxes 42 of the stage controlled by select signal C.

Figure 8:
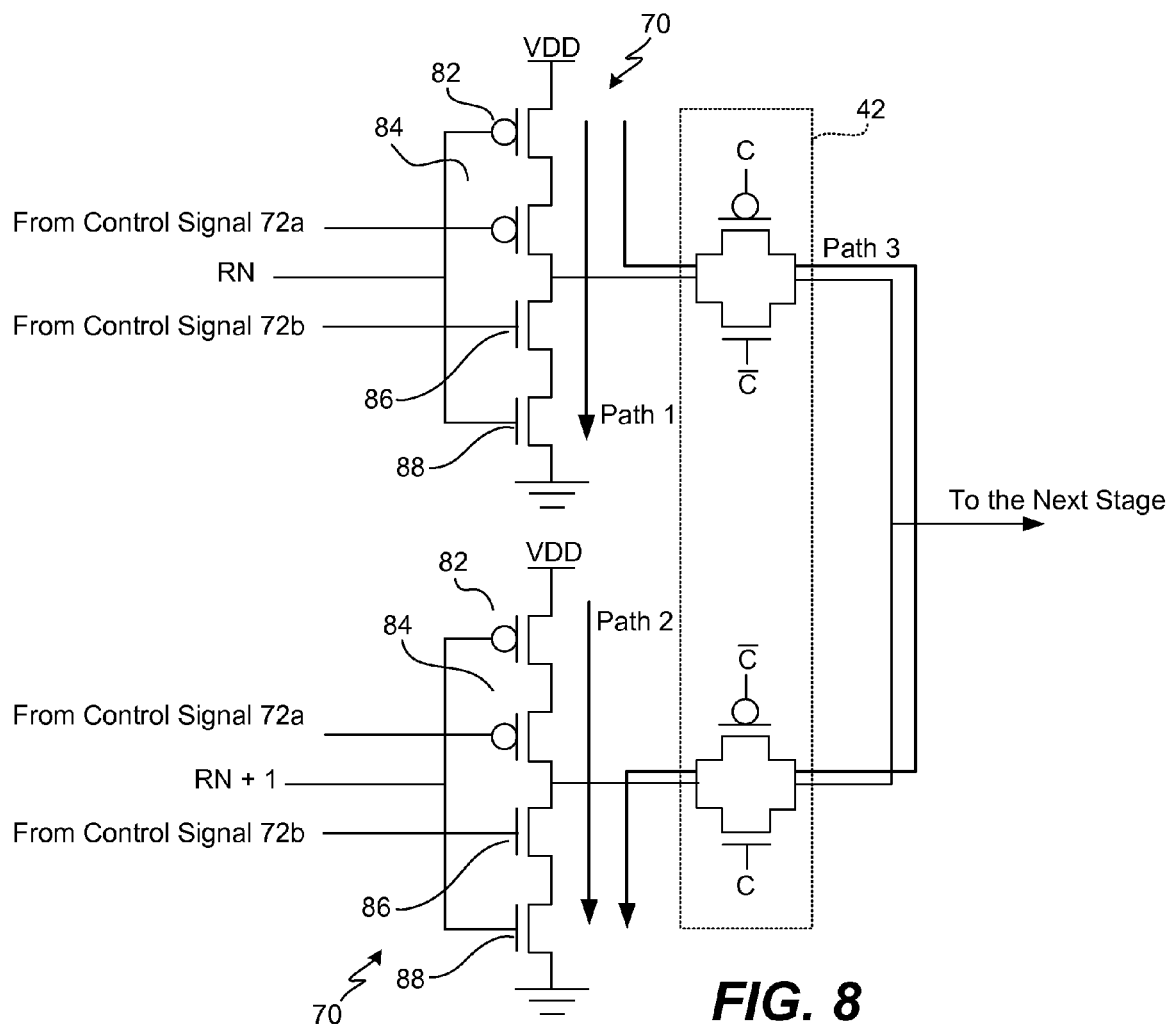
FIG. 8 is a diagram of a tri-state buffer used in the first stage of the Look Up Table of the present invention.

Referring to FIG. 8, a transistor level diagram of two tri-state buffers 70 of the present invention are shown. Each tri-state buffer 70 includes two p-channel transistors 82, 84 and two n-channel transistors 86 and 88 coupled with their channels coupled in series between VDD and ground. For each tri-state buffer 70, the gates of p-channel transistor 82 and n-channel transistor 88 are coupled to their respective configuration bits RN and RN+1 respectively. The gates of the other p-channel transistor 84 and n-channel transistor 86 are coupled to a different combination of control signals from set 72*a* and 72*b*. The outputs of the two tri-state buffers 70 are coupled to a mux 42 controlled by the select signal C. The tri-state buffers 62*a* and 62*b* therefore perform the logical equivalent of the two (i.e., stages A and B) muxing stages in the prior art Look Up Tables.

For a given tri-state buffer, when the decoder signal coupled to the p-channel transistors 84 are low and the decoder signal coupled to n-channel transistors 86 are high, then both transistors are turned on the contents of the configuration RAM cells coupled to the tri-state buffer is allowed to pass to the next stage. For example, if RN is high, then the output going into the C stage mux 42 is low. If RN is low, then the output going into the C stage mux 42 is high.

The buffers 70 are considered "tri-state" because they can assume one of three states, either "0", "1" or a high impedance state "Z".

The Look Up Table of the present invention offers a number of advantages. Foremost, it provides an improvement with the transistor leakage issue. Since there a more transistors (e.g., four) coupled between VDD and ground in each tri-state buffer 70, there is more resistance than otherwise provided with the prior art muxes 42. With a regular inverter, either the PMOS or the NMOS is on. Therefore, within the inverter itself, there is only one "off" transistor between VDD and ground (path 1 and path 2). Path 3 would also only have a single "off" transistor between VDD and ground (the off transistor is the transmission gate. With tri-state buffers, however, the off buffer would have three off transistors between VDD and ground (path 1 or 2, depending on which is off). Path 3 would see a minimum of two off transistors. With the larger resistance, there is less current leakage. The decoder 64 and tri-state buffers 70 also require less surface area or space to fabricate. Due to the fact that 4 inverters were removed. The removal was made possible by the decoder, which reduces the number of stages and minimizes the buffer requirements. As a result, more logic or other resources can be implemented on a PLD die of a given size. Lastly, the circuitry used to implement the Look Up Table of the present invention is substantially the same for a given fabrication process.

The elimination of a number of the buffers 46 in the improved Look Up Table 30 of the present invention also provides a significant benefit. The buffers 46 are actually inverters that use relatively large transistors that consume considerable area and power due to leakage. Thus be eliminating some of the drivers 46, the Look Up Table 30 is smaller and consumes less power. Furthermore, the number of gate delays in the critical path is also reduced, improving the speed of the circuit.

Although the present invention was described in the context of a specific type of programmable logic device having Logic Elements, it should be noted that the present invention may be practiced and used in any type of programmable logic device using Look Up Tables for implementing logic functions. For example, the present invention can be used in programmable gate array (FPGA), including those Complex Logic Blocks as their basic logic block. For more information on Complex Logic Blocks, see the Virtex Family Overview by Xilinx Corporation, Mar. 26, 2005, incorporated by reference herein for all purposes. Similarly, the present invention can be used with PLDs having either ALMs or Logic Elements, as used in the Altera Stratix II and Stratix I devices respectively.

Although the present invention was described in relationship to sixteen input Look Up Table, it should be understood that this example should in no way be construed as limiting. Rather, the present invention can be used with any sized Look Up Table, includes those with more or less than sixteen imports (e.g., 4, 8, 32, 64, etc. inputs).

Although many of the components and processes are described above in the singular for convenience, it will be appreciated by one of skill in the art that multiple components and repeated processes can also be used to practice the techniques of the present invention. Further, while the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

What is claimed is:

1. A programmable logic device, comprising:
    a look up table (LUT) having sixteen configuration bit inputs, wherein a first stage of the LUT comprises:
        tri-state buffers coupled to receive the configuration bit inputs;
        a decoder coupled to receive one or more select signals and to control the tri-state buffers so that a subset consisting of four of the configuration bit inputs is selected by the first stage.

2. The programmable logic device of claim 1, wherein the decoder comprises one or more of the following types of logic gates: AND, NAND, OR, NOR, EXOR, or a combination thereof.

3. The programmable logic device of claim 1, wherein the tri-state buffers include two p-channel transistors and two n-channel transistors.

4. The programmable logic device of claim 3, wherein channels of the two p-channel transistors and the two n-channel transistors are coupled in series.

5. The programmable logic device of claim 4, wherein the channels of the two p-channel transistors and the two n-channel transistors are coupled in series between VDD and ground.

6. The programmable logic device of claim 3, wherein a selected two of the p-channel and the n-channel transistors are coupled to respective configuration bit inputs.

7. The programmable logic device of claim 3, wherein the decoder generates control signals to control the tri-state buffers.

8. The programmable logic device of claim 7, wherein a selected two of the p-channel and the n-channel transistors are coupled to one or more of the control signals.

9. The programmable logic device of claim 8, wherein the control signals are configurable to select one or more of the tri-state buffers.

10. The programmable logic device of claim 9, wherein the control signals are configurable to select a different one or more of the tri-state buffers depending on the select signals.

11. The programmable logic device of claim 1, further comprising one or more muxing stages coupled to outputs of the tri-state buffers, the one or more muxing stages receiving the one or more configuration bit inputs selected by the first stage.

12. The programmable logic device of claim 11, further comprising additional select signals to control the one or more muxing stages.

13. The programmable logic device of claim 1, wherein the LUT comprises N stages.

14. The programmable logic device of claim 13, wherein the configuration bit inputs number $2^N$.

15. The programmable logic device of claim 13, wherein the tri-state buffers number $2^N$.

16. A look up table, comprising:
    a tri-state buffer stage that receives configuration bits;
        a decoder coupled to the tri-state buffer stage that selects one or more of the configuration bits in response to a first set of one or more select signals;
        one or more muxing stages coupled to the output of the tri-state buffer stage that multiplexes the selected configuration bits in response to a second set of one or more select signals and generates a look up table output signal; and
        wherein the tri-state buffer stage is configured to receive 16 configuration bits and the decoder is configured to generate a first select signal and a second select signal to select 4 of the 16 configuration bits.

17. The look up table of claim 16, wherein the tri-state buffer stage includes a first, second, third, and fourth transistor for each configuration bit,
    the first and second transistors both having their gates coupled to a respective configuration bit and their channels coupled in series between VDD and ground, and
    the third and fourth transistors having their gates coupled to decode signals generated by the decoder and their channels coupled in series with the channels of the first and the second transistors between VDD and ground.

18. The look up table of claim 17, wherein the first and third transistors are P-channel transistors and the second and fourth transistors are N-channel transistors.

19. The look up table of claim 17, wherein the first and third transistors are N-channel transistors and the second and fourth transistors are P-channel transistors.

20. The look up table of claim 16, wherein the decoder comprises one of the following types of logic gates: AND, NAND, OR, NOR, EXOR, or a combination thereof.

21. The look up table of claim 16, further comprising a first muxing stage configured to receive the 4 selected configuration bits and to further select 2 of the 4 configuration bits in response to a third select signal.

22. The look up table of claim 21, further comprising a second muxing stage configured to receive the 2 selected configuration bits and to further select 1 configuration bit as the output of the look up table in response to a fourth select signal.

23. A method of fabricating a programmable logic device, comprising:
    fabricating a look up table (LUT) having sixteen configuration bit inputs, wherein a first stage of the fabricated LUT includes tri-state buffers coupled to receive the configuration bit inputs; and
    fabricating a decoder coupled to receive one or more select signals and to control the tri-state buffers so that four of the configuration bit inputs are selected by the first stage.

24. The method of claim 23, wherein fabricating the decoder further comprises fabricating the decoder from one or more of the following types of logic gates: AND, NAND, OR, NOR, EXOR, or a combination thereof.

25. The method of claim 24, wherein fabricating the tri-state$_{13}$ buffers further comprises fabricating two p-channel transistors and two n-channel transistors.

* * * * *